United States Patent
Anderson

(10) Patent No.: US 12,261,614 B2
(45) Date of Patent: Mar. 25, 2025

(54) CLOSED-LOOP GENERATION OF COHERENT OSCILLATORY MATTERWAVES

(71) Applicant: ColdQuanta, Inc., Boulder, CO (US)

(72) Inventor: Dana Zachary Anderson, Boulder, CO (US)

(73) Assignee: ColdQuanta, Inc., Boulder, CO (US)

( * ) Notice: Subject to any disclaimer, the term of this patent is extended or adjusted under 35 U.S.C. 154(b) by 212 days.

(21) Appl. No.: 17/687,641

(22) Filed: Mar. 6, 2022

(65) Prior Publication Data

US 2023/0080889 A1 Mar. 16, 2023

Related U.S. Application Data

(60) Provisional application No. 63/297,853, filed on Jan. 10, 2022, provisional application No. 63/297,785, filed on Jan. 9, 2022, provisional application No. 63/243,336, filed on Sep. 13, 2021.

(51) Int. Cl.
| | |
|---|---|
| *H03L 7/26* | (2006.01) |
| *G01J 3/44* | (2006.01) |
| *G01P 15/093* | (2006.01) |
| *G01V 7/04* | (2006.01) |
| *G06N 10/20* | (2022.01) |
| *H01S 3/00* | (2006.01) |
| *H01S 3/082* | (2006.01) |

(Continued)

(52) U.S. Cl.
CPC .............. *H03L 7/26* (2013.01); *G01J 3/4412* (2013.01); *G01P 15/093* (2013.01); *G01V 7/04* (2013.01); *G06N 10/20* (2022.01); *H01S 3/005* (2013.01); *H01S 3/082* (2013.01); *H04B 10/61* (2013.01); *H04B 10/70* (2013.01)

(58) Field of Classification Search
None
See application file for complete search history.

(56) References Cited

U.S. PATENT DOCUMENTS

| | | |
|---|---|---|
| 4,874,942 A | 10/1989 | Clauser |
| 4,897,844 A | 1/1990 | Schimpe |
| 6,476,383 B1 | 11/2002 | Esslinger |

(Continued)

OTHER PUBLICATIONS

"When Atoms Behave as Waves: Bose-Einstein Condensation and the Atom Laser," Ketterle, MIT-Harvard Center for Ultracold Atoms, Dec. 8, 2001. (Year: 2001).*

(Continued)

*Primary Examiner* — Uzma Alam
*Assistant Examiner* — Chad Andrew Reverman
(74) *Attorney, Agent, or Firm* — Michael J. Attisha; Greenberg Traurig, LLP

(57) ABSTRACT

A closed-loop coherent oscillator matterwave (COMW) system generates a COMW. Atoms tunnel into a COMW oscillator to populate the COMW generated and emitted by the oscillator. A detuned light-field-based COMW splitter divides the emitted COMW between an output COMW and a regulator COMW. A COMW resonator, including detuned light-field mirrors, receives the regulator COMW and returns a feedback COMW. A COMW sensor evaluates the intensity of the feedback COMW. A controller adjusts the oscillator based on the evaluation to optimize the COMW output of the system.

15 Claims, 15 Drawing Sheets

(51) Int. Cl.
*H04B 10/61* (2013.01)
*H04B 10/70* (2013.01)

(56) References Cited

U.S. PATENT DOCUMENTS

| | | | |
|---|---|---|---|
| 9,916,913 B2 | 3/2018 | Compton | |
| 2008/0007817 A1 | 1/2008 | Hochberg | |
| 2009/0046976 A1 | 2/2009 | Hillis | |
| 2013/0169157 A1 | 7/2013 | Arman | |
| 2016/0064108 A1* | 3/2016 | Saffman | G21K 1/006 250/251 |
| 2016/0141533 A1 | 5/2016 | Britt | |
| 2017/0016710 A1 | 1/2017 | Black | |
| 2017/0199036 A1 | 7/2017 | Moxley, III | |
| 2020/0161016 A1 | 5/2020 | Anderson | |
| 2020/0161446 A1 | 5/2020 | Anderson | |
| 2022/0164501 A1* | 5/2022 | Nosanow | G06N 10/60 |

OTHER PUBLICATIONS

Wolfgang Ketterle, Atom Laser, McGraw-Hill 1999 Yearbook of Science & Technology.

Dana Z. Anderson, Mater Waves, Single-Mode Excitation of the Matter-Wave Filed, and the atomtronic Transistor Oscillator, Physical Review A 104, 033311 (2021), published Sep. 8, 2021.

Roy J. Glauber, Amplifiers, Attenuators, and Schrödinger's Cat ∧a, Dec. 18, 1985.

Beer et al., Training Deep Quantum Neural Networks, Nature Communications, 2020, pp. 1-6.

Chih et al., Reinforcement-Learning-Based Matter-Wave Interferometer in a Shaken Optical Lattice, Physical Review Research 3, 2021, pp. 033279-1-033279-10.

Dupoint et al., Calibrating the Classical Hardness of the Quantum Approximate Optimization Algorithm, PRX Quantum 3, 2022, American Physical Society, pp. 040339-1-040339-14.

Graham et al., Demonstration of Multi-Qubit Entanglement and Algorithms on a Programmable Neutral Atom Quantum Computer, arXiv:2112.14589v3 [quant-ph] Feb. 11, 2022.

Huang et al., Quantum Advantage in Learning from Experiments, arXiv:2112.00778v1 [quant-ph] Dec. 1, 2021, pp. 1-52.

Jones et al., K-spin Hamiltonian for Quantum-Resolvable Markov Decision Processes, arXiv:2004.06040v1 [quant-ph] Apr. 13, 2020, pp. 1-9.

Liang-Ying Chih, Machine-Learning-Based Design of Quantum Systems for Extreme Sensing, Thesis, 2022, pp. 1-138.

Weidner et al., Experimental Demonstration of Shaken Lattice Interferometry, arXiv:1801.09277v1 [quant-ph] Jan. 28, 2018, pp. 1-5.

Brad A. Dinardo, Single Atom Delivery into a Bottle Beam Trap Using an Optical Conveyor Belt and Quantum Coherent Gain in a Matterwave Transistor, 2018.

Caliga et al., A Matterwave Transistor Oscillator, Department of Physics, University of Colorado, and JILA, Jan. 12, 2018, pp. 1-5.

Wikipedia, Atom Interferometer, Jan. 24, 2021.

Wikipedia, Coherent State, Jan. 24, 2021.

* cited by examiner

CLOSED-LOOP GENERATION OF COHERENT OSCILLATORY MATTERWAVES

BACKGROUND

Optical sensors are limited in precision by the wavelengths of light employed. The de Broglie wavelengths associated with atoms can be several orders of magnitude shorter than optical wavelengths. Accordingly, extremely high precision sensors and instruments, e.g., interferometers and ring gyros, have been developed based on the de Broglie matterwaves of atoms. However, instruments based on atom interferometry must be larger than desired to achieve satisfactory signal-to-noise ratios. What is needed are sensors with a better tradeoff between size and signal-to-noise ratios than is provided by sensors based on de Broglie matterwaves.

DETAILED DESCRIPTION

The present invention provides for closed-loop generation of coherent oscillatory matterwaves (COMW). The COMW can be generated using a COMW generator system and a feedback system to regulate the COMW output. The COMW generator system includes a continuous source of condensed matter, e.g., a condensed population of rubidium 87 ($^{87}$Ru) atoms, that feeds a Bose-Einstein condensate (BEC) oscillator. Within the oscillator, a standing COMW intensifies as incoming condensed matter reinforces reflected matterwaves. The oscillator functions as a Fabry-Perot interferometer such that the intensified oscillations result in comparably intense transmission of COMW out of the oscillator.

The feedback system can include a COMW resonator and a detector to measure the intensity of COMW transmitted by the resonator. The feedback system serves to regulate the frequency and to narrow the linewidth (frequency spread) of the COMW. Instruments (accelerometers, gyros) based on these COMW can achieve improved shot-noise-limited signal-to-noise ratios (S/N) for a given instrument size when compared to counterpart instruments based on de Broglie wavelengths.

Coherent oscillatory matterwaves (COMW) are distinct from de Broglie matterwaves. COMW wavelengths λ are associated with the separation L of mirrors between which oscillations occur so that λ=2L IN where N is a positive integer; de Broglie wavelengths $\lambda_{db}$ are associated with the momentum p such that $\lambda_{db}$=h/p where h is Plank's (unreduced) constant. COMWs can be accelerated (e.g., reflected or split) using constant optical gradients; de Broglie matterwaves can be accelerated using Bragg or Raman scattering induced by pulsed light. Accordingly, COMW provide for continuous wave measurements, whereas measurements based on de Broglie matterwaves are pulsed. COMW measurements are multi-cycle, whereas de Broglie matterwave measurements tend to be single-shot; as a result, the latter must be made larger to equal the noise performance of the former. For instruments of similar size, COMW instruments provide greater shot-noise-limited S/N ratios than do de Broglie matterwave instruments.

Figure 1:
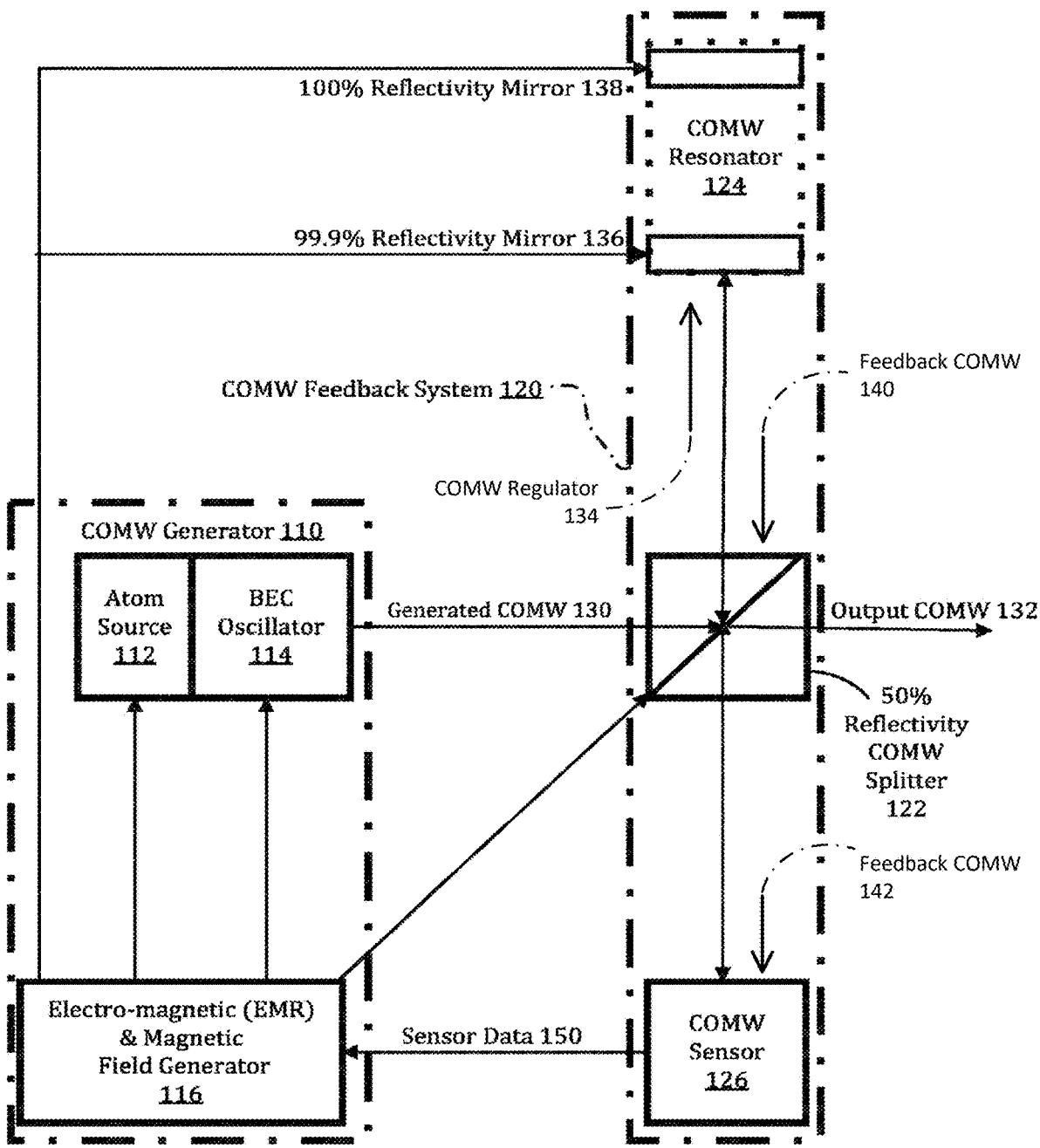
FIG. 1 is a schematic diagram of a coherent oscillatory matterwave (COMW) generator system.

As shown in FIG. 1, a closed loop coherent oscillatory matterwave (COMW) generation system 100 includes an COMW generator 110 and a feedback system 120. COMW generator 110 includes an atom source 112, a Bose-Einstein condensate (BEC) oscillator 114, and an EMR and magnetic field controller 116. COMW feedback system 120 includes a COMW splitter 122, a COMW resonator 124, and a COMW sensor 126. Alternative embodiments substitute other molecular-entity (e.g., including ions and polyatomic molecules) bosons for atoms and some embodiments omit a COMW sensor.

Figure 2A:
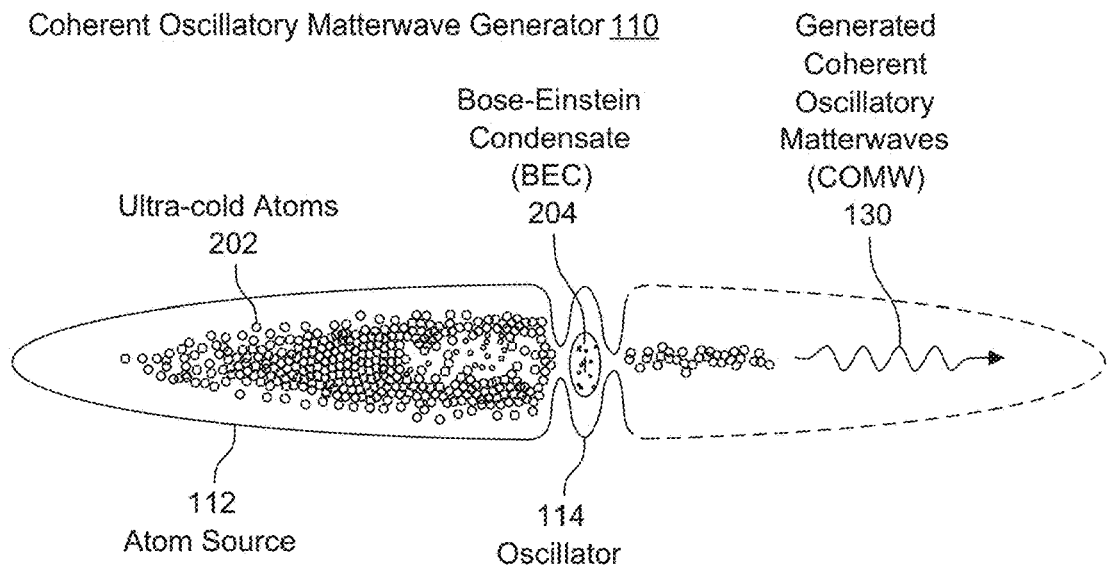
FIGS. 2A and 2B are schematic diagrams of a COMW generator of the system of FIG. 1.
Figure 2B:
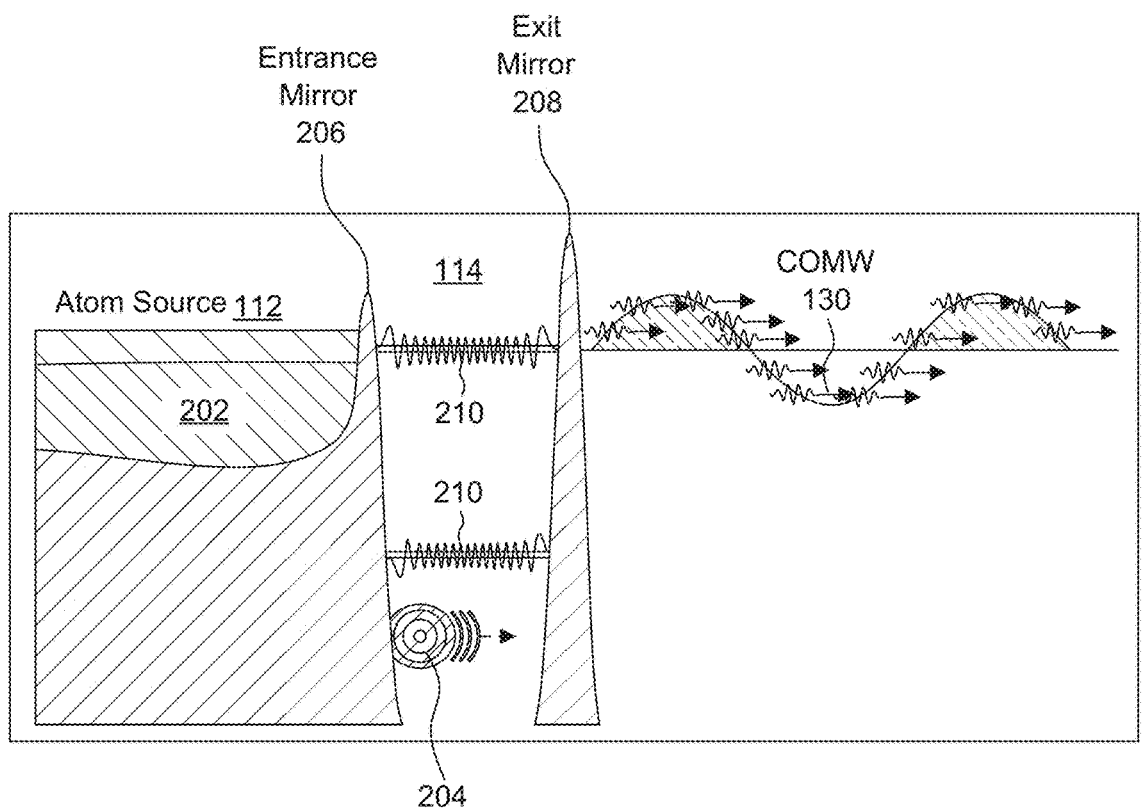

As illustrated in FIGS. 2A and 2B, source 112 maintains a reservoir of ultra-cold atoms 202. Atoms 202 can tunnel from source 112 to BEC oscillator 114; as they do so, they cool to form a Bose-Einstein condensate (BEC) 204. The dipole-oscillating BEC 204 oscillates back and forth between an entrance mirror 206 and an exit mirror 208 of oscillator 114 forming standing waves 210 (FIG. 2B). The standing waves intensify as newly arriving ultra-cold atoms enter oscillator 114. Oscillator 114 acts as a Fabry-Perot atom interferometer and, so, outputs generated COMW 130 with an output intensity and wavelength corresponding to that of standing matterwaves 210. Energies of interest correspond to free-space COMW wavelengths on the order of 1 μm and less. In this microwave regime, atomic oscillator systems are of interest for their practical potential in quantum signal processing, quantum sensing, and other information processing contexts.

COMW 50% reflectivity splitter 122 (FIG. 1) splits generator COMW 130 into a generation system output COMW 132 and a regulator COMW 134. A portion (e.g., 1%) of regulator COMW 134 enters resonator 124 via a 99% reflectivity and 1% transmissivity front mirror 136; thus, 99% of COMW 134 is reflected. The portion of COMW 134 that enters COMW resonator 124 reflects off a 100% reflectivity rear mirror 138 and oscillates between mirrors 136 and 138, forming a standing wave with a wavelength dependent on the separation of mirrors 136 and 138. The oscillations intensify as incoming COMW reinforces the oscillations. As a result, an intense feedback COMW 140 with the wavelength imposed by resonator 124 exits resonator 124. Feedback COMW 140 is split by COMW splitter 122, with a portion, labeled "feedback COMW 142", reaching COMW sensor 126. The other portion reflected by splitter 122 is dumped.

Feedback COMW 142 is evaluated by sensor 126. Sensor 126 captures atoms in feedback COMW 142 for a known duration. Sensor 126 then excites the captured atoms so that they fluoresce. Sensor 126 then measures the fluorescence to evaluate the intensity of feedback COMW 142. A low feedback intensity indicates that the wavelength output by resonator 124 does not closely match the wavelengths output by oscillator 114. Assuming that the wavelength output by resonator 124 is a target wavelength selected for generation system 100, a measurement result of low intensity can indicate oscillator 114 may need to be retuned. On the other hand, the spacing of mirrors 136 and 138 can be adjusted to control the output wavelength of feedback COMW 140 and, thus, the output of COMW generator 110 and system 100.

To this end, sensor 126 sends intensity sensor data 150 to EMR and magnetic field generator 116. In response, generator 116 adjusts the EMR and magnetic fields used for source 112 and oscillator 114. For example, generator 116 can adjust the separation of oscillator mirrors and thus the wavelengths of internal oscillations and generated COMW 130, thus, closing the regulation loop for COMW generation system 100.

Figure 3:
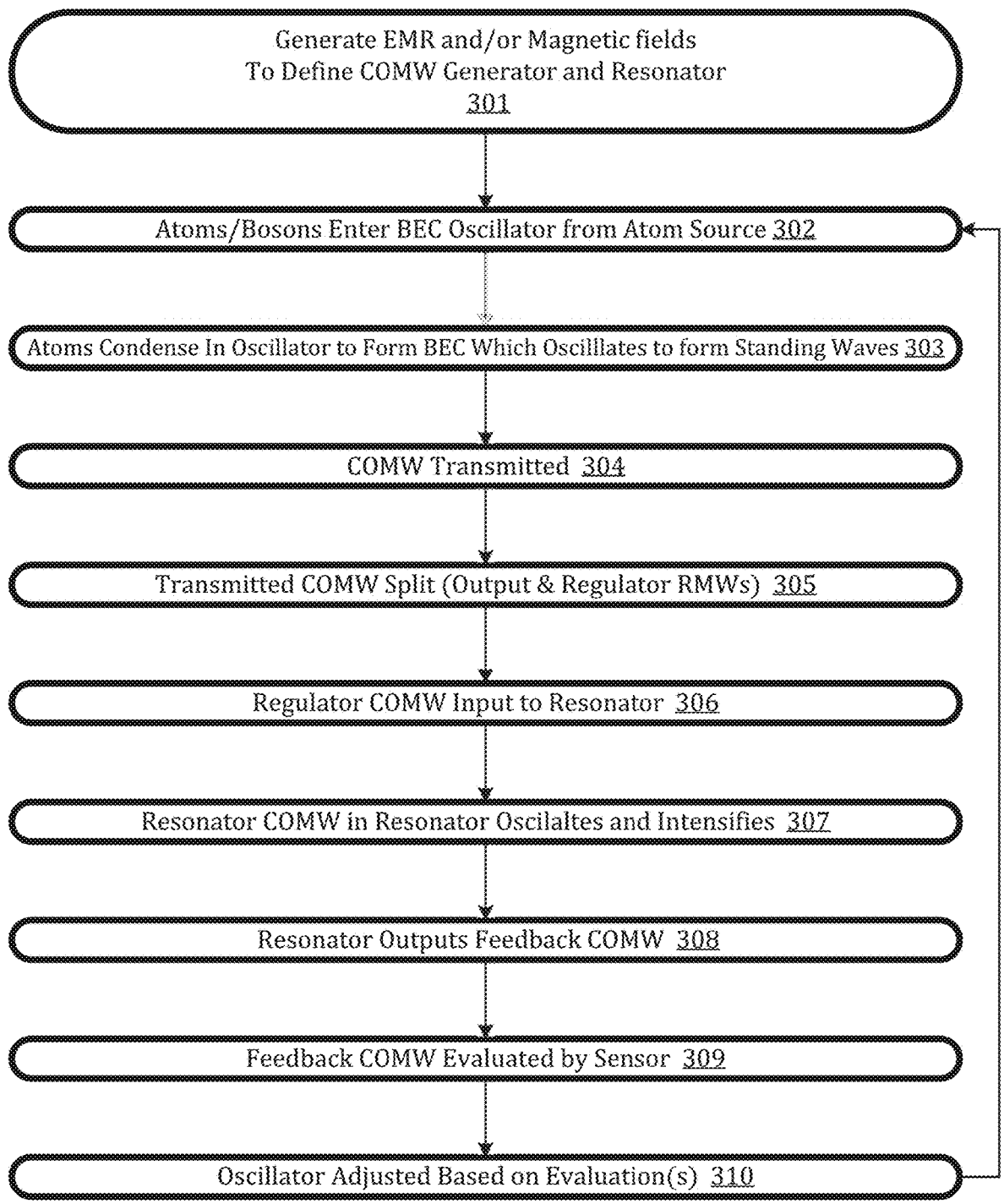
FIG. 3 is a flow chart of a COMW generation process implementable in the system of FIG. 1 and in other systems.

A closed-loop coherent oscillatory matterwave (COMW) generation process 300 is flow-charted in FIG. 3. At 301, EMR and/or magnetic fields are generated to define a COMW generator and a COMW resonator. At 302, atoms enter a BEC oscillator from an atom or other molecular-entity boson source. For example, atoms can tunnel through an entrance barrier/mirror to enter a BEC oscillator. At 303, atoms cool to form a Bose-Einstein condensate (BEC). The BEC oscillates between the entrance and exit barriers/mirrors to generate standing COMW. At 304, the COMWs are transmitted through the exit barrier. At 305, the transmitted COMW is split between an output COMW and a regulator COMW.

At 306, a portion of the regulator COMW is input to a resonator. At 307, the COMW within the resonator oscillates and intensifies at frequencies determined by the resonator cavity length. At 308, the resonator outputs a feedback COMW. At 309, the feedback COMW is evaluated by a sensor. For example, a number of atoms captured for a given time interval can be counted to provide a measure of feedback COMW intensity. At 310, the COMW generator can be adjusted based on the evaluation, e.g., to maximize COMW intensity. Process 300 is continually repeated to narrow and lock the wavelength of the COMW exiting the oscillator and the COMW system output.

Figure 4:
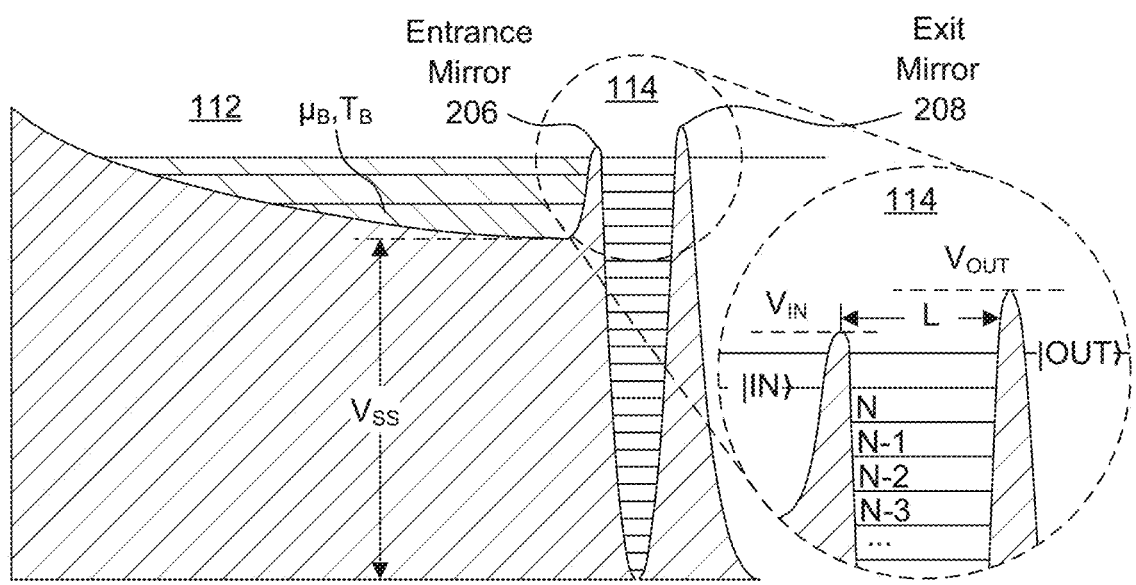
FIG. 4 is a schematic diagram of the COMW generator of FIG. 2 showing adjustable source and oscillator parameters.

Some of the parameters that can be adjusted in response to feedback are indicated in FIG. 4. The mirror separation L between the entrance mirror 212 and the exit mirror 214 constrains the wavelengths available for standing waves 210 (FIG. 2B) and, thus, the wavelengths available for generated COMW 130 (FIGS. 1, 2A and 2B). Other mirror-related parameters include peak potential |IN⟩ for the entrance mirror 206, peak potential |OUT⟩ for the exit mirror 208, and the difference between those peak potentials. The peak potential can affect the number N of energy levels in the oscillator, which can affect generated COMW 130. In the illustrated embodiment, the peak potential of the exit mirror is slightly greater than the peak potential of the entrance mirror and the difference in peak potential can have an effect on the strength and spectrum of generated COMW 130.

Atoms can be accelerated toward a red-tuned EMR field and/or away from a blue-detuned EMR field. By "detuned" is meant differing from a resonance of a matterwave particle (e.g., atom) by a non-zero amount less than 1% of the EMR wavelength. Thus, a reflector can be defined by a relatively high intensity region of a blue-detuned EMR field or a relatively low intensity region or a dark region of a red-detuned EMR field. Atoms moving against or up the gradient can thus be reflected or split by the gradient. Thus, such optical gradients are used to define the COMW mirrors and COMW splitters in embodiments of the invention.

In other words, a COMW can be reflected or split as it transitions from a first region to a second region where the second region is "relatively blue-detuned" when compared to the first region. The most typical example of a transition to a relatively blue-detuned region is a transition from a dark (no light field) region to a region with a light field that is blue-detuned relative to a resonance transition of the constituent particles of a COMW. Alternatively: 1) the first region can be resonant with or red-detuned with respect to the resonance transition. A dark or "in-tune" region can reflect COMW arriving from a red-detuned region, and a red-detuned region can reflect COMW from a more red-detuned region. All these are examples of a relatively blue-detuned region serving as a COMW reflector (or splitter).

Figure 5A:
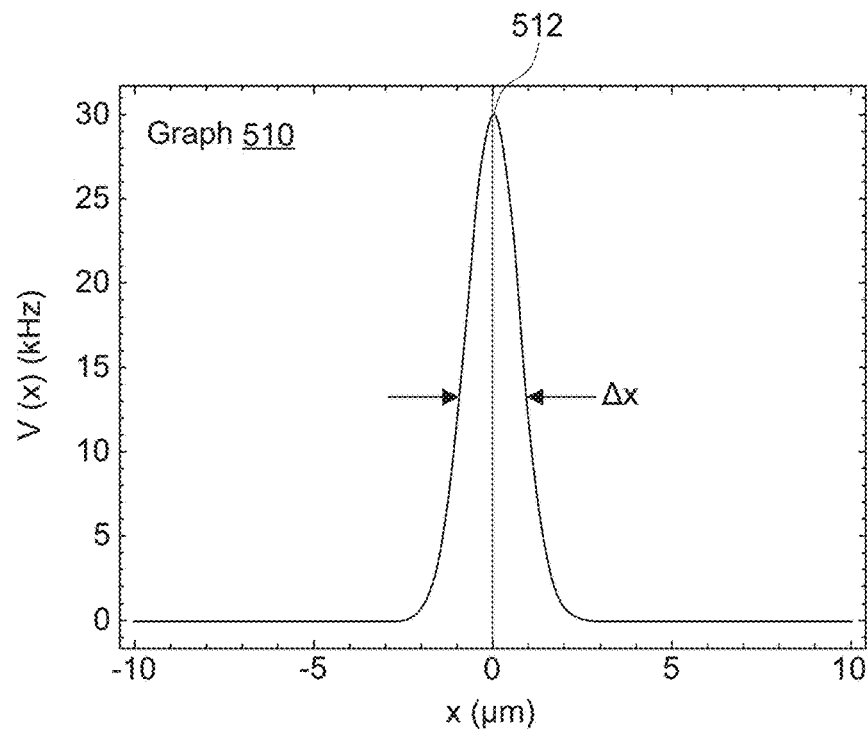
FIG. 5A is a graph of a spatial distribution of potential energy for detuned gaussian laser beam "knives" used to form barriers, mirrors, and splitters in the system of FIG. 1.
Figure 5B:
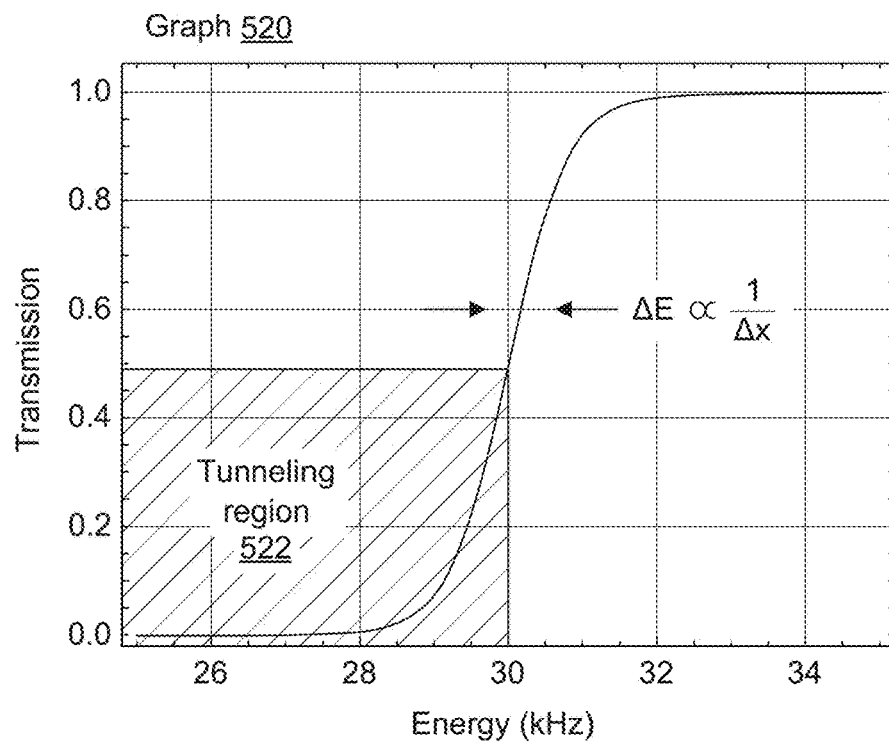
FIG. 5B is a graph of transmission versus energy for the "knives" of FIG. 5A.

As shown in graph 510 of FIG. 5A, the light field can have a Gaussian distribution with a peak potential energy at a center position 512 and that tapers off to either side. Accordingly, system 100 (FIG. 1) uses intense laser generated light fields to form 100% reflectivity mirror 118 of resonator 106. Lowering the light-field intensity can lower the reflectivity to yield a partially transmissive mirror. As shown in FIG. 5B, transmission increases with COMW energy, with about 50% transmission with energy at 30 kHz. Graph 510 of FIG. 5A and graph 520 of FIG. 5B indicate that transition width from 0 to 100% transmission is inversely proportional to Gaussian width. The Gaussian provides 50% transmission at peak potential. Transmissions of 50% and below occur as tunneling, as indicated by tunneling region 522.

System 100 uses lower intensity blue-detuned light fields to form 99% reflectivity mirror 116 of resonator 106 (FIG. 1) so that 1% of the incident regulator COMW can transmit into resonator 106. In addition, entrance mirror 202 and exit mirror 206 of oscillator 114 (FIG. 2) are partially transmissive mirrors. Orienting a partially transmissive mirror at an angle relative to the direction of a COMW results in a matterwave splitter, such as splitter 104 (FIG. 1). Also, the potential energy level of oscillator 114 affects the number N of energy levels available in oscillator 114, which can affect the modes available to standing matterwave 210 and generated COMW 130.

Accordingly, EMR and magnetic field generator 116 provides blue-detuned laser light fields to achieve the desired reflectivity and transmissivity for oscillator mirrors 212 and 214, resonator mirrors 136 and 138, and splitter 122. In response to feedback or operator instructions, light and magnetic field generator 116 can adjust intensity, shape (Gaussian, super-Gaussian, uniform, etc.), and separation of oscillator mirrors 212 and 214 to optimize generated COMW 130.

Parameters associated with atom source 112 can also be adjusted in response to feedback. These include an electrical potential floor $V_{ss}$ (FIG. 4) for source atoms relative to the potential in oscillator 114, the temperature $T_B$ and the chemical potential $\mu_B$ for the source atoms 202. The electrical potential floor $V_{ss}$ affects the kinetic energy of atoms once they tunnel into oscillator 114 and can be adjusted by having light and magnetic field generator 116 adjust the intensity for magnetic fields at atom source 112. Atom temperature $T_B$ can be adjusted to control the kinetic energy and variability of atoms in source 112 and thus the rate at which atoms transfer from source 112 to oscillator 114.

Figure 6:
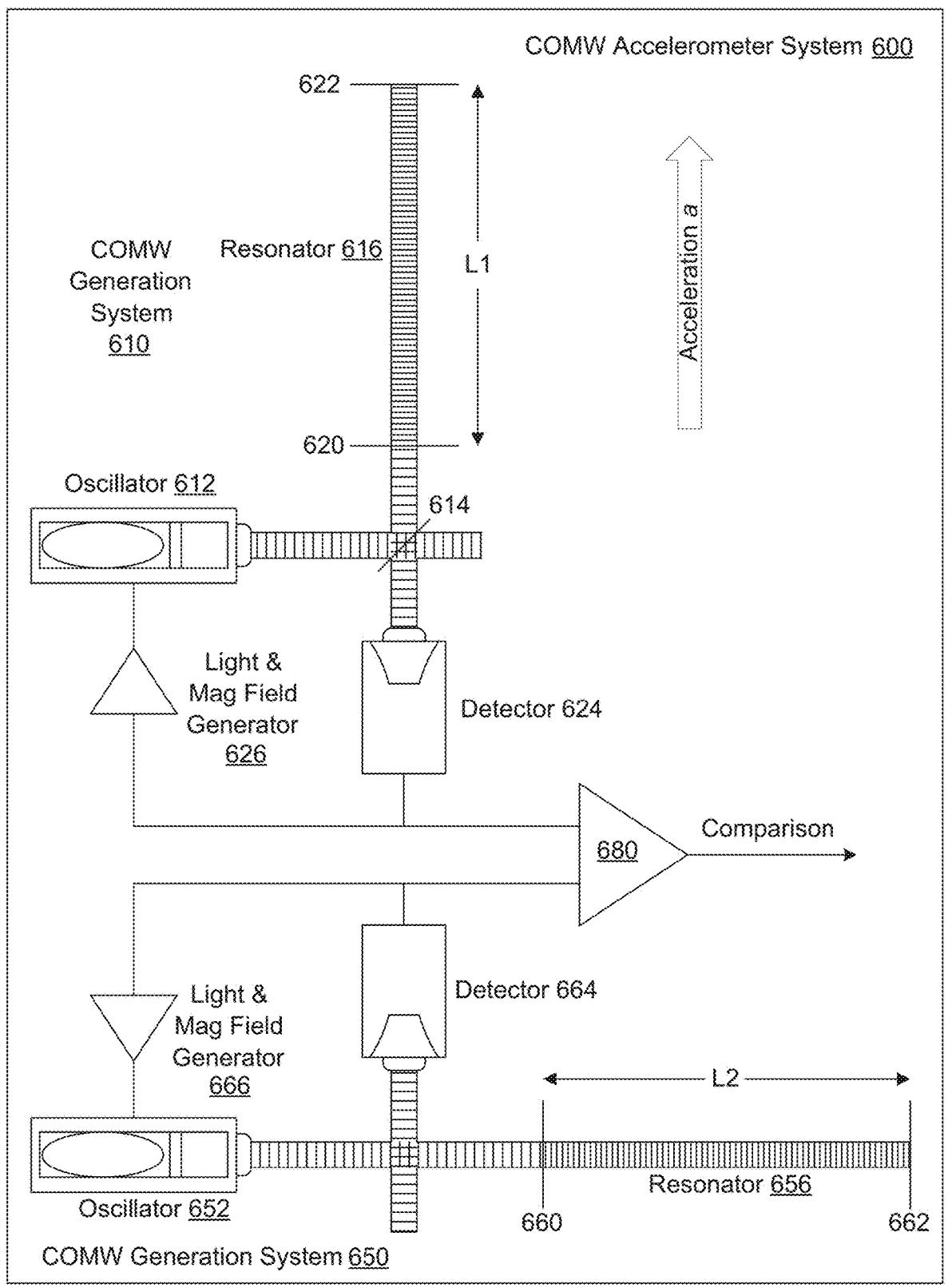
FIG. 6 is a schematic diagram of an accelerometer including two of the COMW resonator systems of FIG. 1.

As shown in FIG. 6, an accelerometer system 600 can include a pair of COMW systems 610 and 650. COMW system 610 includes an oscillator 612, a COMW splitter 614, a resonator 616 with mirrors 620 and 622, a detector 624, and a light and magnetic-field generator 626. COMW system 650 includes an oscillator 652, a COMW splitter 654, a resonator 656 with mirrors 660 and 662, a detector 664, and a light and magnetic-field generator 666. The outputs of detectors 624 and 666 are input to comparator 680 to provide a comparison that correlates with acceleration.

Systems 610 and 650 are nominally identical in the absence of acceleration to the extent that, in the absence of acceleration, the distance L1 between mirrors in resonator 616 is equal to the distance L2 between mirrors in resonator 656, the frequency $\omega_1$ of the resonating matterwaves in resonator 616 deviates from the resonant frequency $\omega_2$ of resonator 656. Gravity/acceleration g is then proportional to the resonant frequency difference $\Delta\omega = \omega_1 - \omega_2$:

$$g = \frac{\Delta\omega}{\kappa_a} = \Delta\omega \frac{4\omega_d \hbar}{\omega_g L m}$$

The uncertainty of the gravity/acceleration measurement is proportional to the linewidth $\delta v$ of the resonator, $$\delta g = \frac{1}{\kappa_a}\delta v \cong \frac{1}{FL^2 \omega_g}\left(\frac{2\hbar\omega_d}{m}\right)^{3/2}\frac{1}{\sqrt{\mathcal{N}}}$$

where $\mathcal{N}$ is the number of atoms collected during measurement.

Figure 7:
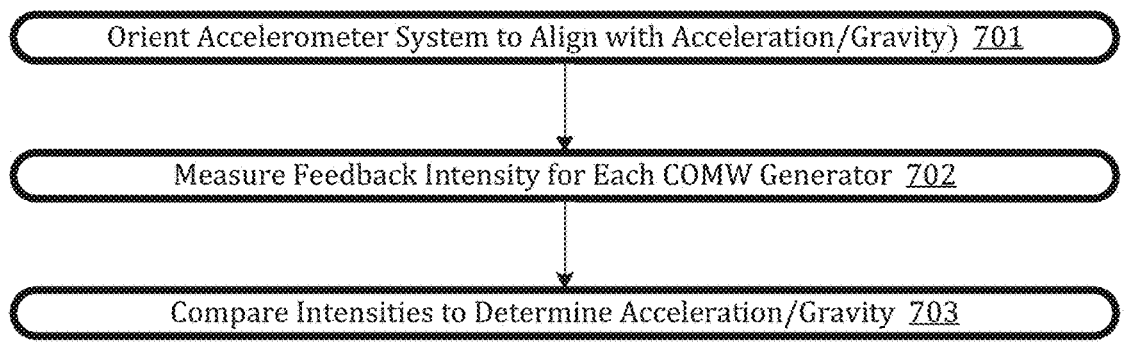
FIG. 7 is a flow chart of an accelerometer process implementable in the accelerometer of FIG. 6 and in other systems.

A COMW accelerometer process 700, flow charted in FIG. 7, can be implemented in the COMW accelerator system 600 (FIG. 6) and in other systems. At 701, COMW system 600 is oriented so that resonator mirrors 620 and 622 of resonator 616 are separated along the direction of acceleration; concomitantly, resonator 656 is oriented orthogonal to the direction of acceleration/gravity. This alignment, if needed, can be implemented mechanically with a suitable weight distribution for system 600. At 702, intensity of feedback COMW is measured. At 703, intensities are compared to determine the magnitude g of gravity/acceleration, e.g., according to the following formula:

$$g = \Delta\omega/\kappa_a$$

where $$\kappa_a = \frac{\omega_g}{\omega_d}\frac{L}{4}\frac{m}{\hbar}$$

where $\omega_g$ is the frequency aligned with gravity, $\omega_d$ is the frequency orthogonal to gravity (e.g., without acceleration or gravity), L=L1=L2, and m is the mass (e.g., of $^{87}$Ru). Thus, $$g = \frac{\Delta\omega}{\kappa_a} = \frac{\Delta\omega\omega_g L m}{\omega_d 4\hbar}.$$

The uncertainty of a measurement of g is given by the linewidth $\delta v$ of the resonator:

$$\delta g = \frac{1}{FL^2 \omega_g}\left(\frac{2\hbar\omega_d}{m}\right)^{3/2}\frac{1}{\mathcal{N}},$$

wherein, again, $\mathcal{N}$ is the number of atoms collected during a measurement.

In an alternative embodiment, gravity/acceleration can be measured even though none of the resonators is aligned with gravity/acceleration. In another embodiment, gravity measurements are made by mixing the outputs of the two COMW generator outputs and measuring the beat frequency. In a further embodiment, gravity is measured by retuning the gravity aligned mirrors (by adjusting mirror separation) and determining the change in frequency as a function of the change in separation required to equalize the frequency or detector outputs.

The coherent oscillatory matterwave interferometry (COMWI) provided for by the present invention is based on matterwaves associated with a harmonic oscillator, whereas light-pulse atom interferometry (LPAI) is based on de Broglie matterwaves associated with individual particles. Several corollary differences follow. Whereas LPAI measurements provide pulsed measurements, COMWI provides for continuous wave measurements. Whereas, in LPAI, atoms are accelerated with multiple Raman or Bragg pulses, in COMWI, atoms are accelerated by optical intensity gradients. For example, in LPAI, splitting and reflection are carried out by Raman or Bragg pulses, while in COMWI, splitting and reflecting are achieved with stationary gaussian light beams. In LPAI, acceleration introduces a phase difference, in COMWI, acceleration introduces a frequency difference.

Whereas, in LPAI, a single split/recombine sequence is used, COMWI uses resonant interferometry which involves multiple passes. Accordingly, COMWI achieves superior shot-noise limited signal-to-noise ratio (S/N) due to the narrower line width achievable using a combination of oscillator and resonator. S/N ratio can be traded for size. For example, COMWI provides for a smaller structure for similar S/N performance. Thus, smaller gravitometers, accelerometers, and gyros can be achieved using COMWI.

The BEC oscillator emits an atom flux having potential and kinetic energy that varies sinusoidally in time with the oscillator's frequency ω in such a way that the individual particle's total energy, $E_a \equiv \hbar \omega_a$, remains constant. Given a sufficiently large flux from the oscillator that it can be treated classically, the emission can be described by a pair of scalar wavefields:

$$\mathcal{F}_{(z,t)} = \mathcal{F}_0 \cos(kz - \omega t)$$

$$\mathcal{J}_{(z,t)} = \mathcal{J}_0 \cos(kz - \omega t)$$

The oscillator emission admits coupling to resonant structures. Herein, the focus is on the effect of inertial forces, but the framework is extendable to the sensing of other fields with which the atom interacts.

The wave amplitudes have dimensions of acceleration for $\mathcal{F}$ and momentum for $\mathcal{J}$. The two wave amplitudes are related through a real-valued impedance Z:

$$\mathcal{F}_0 = Z \mathcal{J}_0$$

where $$Z = n^2 \frac{\omega}{2m} \equiv n^2 Z_0$$

Here m is the atomic mass, and n plays the role of a refractive index:

$$n \equiv \sqrt{\frac{\omega}{\omega_a}}$$

The waves propagate at the group velocity of a de Broglie wave:

$$v = \frac{1}{n} \sqrt{\frac{2\hbar\omega}{m}} = \sqrt{\frac{2\hbar\omega_a}{m}}$$

and are thus associated with the wave number:

$$k = n\sqrt{\frac{m\omega}{2\hbar}}$$

Note that the wave number decreases with an increase of the particle energy (i.e., with a decrease in the refractive index), while that of a de Broglie waves increases. When necessary to distinguish our coherent oscillatory matter waves (which exhibit Glauber coherence) from the more customary association of the term "matterwave" the former can be referred to as "de Broglie matterwaves" or "classically coherent matterwaves".

The COMW amplitudes are given by the (experimentally measurable) atom flux $I_a$ given in units of particles/s:

$$\mathcal{J}_0 = \frac{2}{n} \sqrt{m\hbar I_a}$$

The oscillator is thus fully specified by its oscillation frequency ω its atom flux $I_a$, and the energy $E_a$ of the emitted atoms, which can be alternatively expressed in terms of their velocity v, or the index of refraction n. The oscillator output can propagate in a matterwave wave guide or coupled to the vacuum.

A COMW, illustrated in FIG. 1, is incident on a matterwave resonator, as, having a pair of mirrors separated by a distance L. Matterwave elements such as mirrors and beamsplitters are straightforward to implement with Gaussian-shaped laser beams tuned to the blue side of atomic resonance. Such elements can be modeled with delta-function potential barriers:

$$U_j(Z) = U_{ja} \delta(z - z_j)$$

The matterwave amplitude reflection and transmission coefficients r and t associated with such an element are easily obtained from Schrödinger's equation:

$$r = -e^{i(\alpha_j)} \cos(\alpha_j)$$

$$t = e^{-i(\alpha_j)} \sin(\alpha_j),$$

for which $$\alpha_j = \tan^{-1}\left(\frac{\hbar^2 k}{m U_{ja}}\right)$$

The corresponding reflection and transmission probabilities are simply:

$$R_j = \lceil r_j \rceil^2 = \cos^2(\alpha_1),$$

$$T_j = \lceil t_j \rceil^2 = \sin^2(\alpha_j),$$

It is straightforward to adjust an element's reflection and transmission coefficients by manipulating the height $U_{j0}$ of the barrier.

A resonator can be formed from a pair of identical barriers having reflection probability $R_1 = R_2 \equiv R$ with R close to unity, transmission probability $T = 1 - R$, and located at $z=0$ and $z=L$. Analysis of the system proceeds precisely as it does for the optical case. Such a system exhibits a spectrum of resonances such that there is an integral number q of half-wavelengths between the mirrors, or equivalently, by a set of resonant frequencies:

$$v_q = q\left(\frac{v}{2L}\right)$$

The small phase shifts evident in the above equation have been lumped into the cavity length L. A measure of the quality of a resonator in often given by the finesse:

$$F = \pi \frac{\sqrt{R}}{1 - R}$$

from which one can determine a resonator linewidth:

$$\delta v_p = \frac{v}{2LF}$$

As is also the optical case, the field amplitude is much larger than the incident amplitude when the mirror transmissions are small, and consequently so is the atom flux associated with the resonator:

$$I_R = \frac{I_a}{T}.$$

Due to an acceleration a along the resonator axis, in the frame of the resonator, the particles' energy varies during propagation in the resonator. Given the direction of acceleration as shown in FIG. 6, the average particle energy in a round-trip between the mirrors is:

$$\hbar\bar{\omega}_a = \hbar\omega_a\left(1 + \frac{maL}{2\hbar\omega_a}\right),$$

The particle energy variation will cause a shift in the resonant frequencies:

$$v'_q = q\frac{1}{2L}\sqrt{\frac{2\hbar\bar{\omega}_a}{m}} \approx v_q\left(1 + \frac{maL}{2\hbar\omega_a}\right),$$

this latter assuming that the incident particle energy is much larger than the energy change due to acceleration. The acceleration a can be determined by locking the oscillator frequency to one particular resonant mode, $\omega = 2\pi v_q$ and measuring its frequency shift:

$$\Delta v_q \equiv v'_q - v_q = \kappa_{a_q}\alpha$$

for which the scale factor $$\kappa_{a_q}a = \frac{q}{4v}\frac{\omega L}{4\pi v^2}.$$

is associated with the finite linewidth of the resonator, which can be a characteristic acceleration resolution of the interferometer:

$$a_{res} = \frac{2\pi}{F}\frac{v^3}{\omega L^2}.$$

(Note that with this configuration the dynamic range is determined by the requirement that atoms have sufficient energy to reach the far barrier when the acceleration is in the direction of atomic velocity, $\alpha_{max} << v^2/L$ In traditional atom interferometry, acceleration introduces a phase rather than a frequency shift:

$$\Phi = \kappa_{LP}\alpha,$$

for which $$\kappa_{LP} = k_{eff}T^2.$$

where $k_{eff}$ is an effective wavenumber and T is the propagation time of the atoms in the interferometer.

The benefits of a resonant approach are most apparent when the size of the interferometer is restricted. Thus, assuming an interferometer has length L and also assuming that the atomic velocity is the same in both systems and that the effective wavenumber is given directly by the atomic velocity. Then $T=L/v$ and $k_{eff} = mv/\hbar$. One can thus attribute an acceleration resolution for the non-resonant interferometer:

$$a_{res} = \pi\frac{\hbar}{m}\frac{v^3}{2\omega_a L^2}$$

key differences are that acceleration induces a frequency shift rather than a phase shift, and the role of the finesse is enhancing the signal-to-noise ratio.

The Bose-condensed reservoir of atoms in the large source well provides a chemical potential that drives oscillator dynamics. The oscillator can be taken to be harmonic, and it can be treated using a many-body physics approach, beginning with the ansatz that the oscillator particles Bose condense in a displaced ground state rather than in the minimum energy state. A pair of high-lying oscillator-well states couple the source and vacuum to the oscillator well. The coherently oscillating atoms of the oscillator cause coupling between the oscillator-well states, which induces a particle flux from source to vacuum—a current that self-consistently maintains the oscillation of the oscillator and carries away heat, allowing the oscillator atoms to remained condensed. The output flux is carried by a COMW as the classical limit of a many-body coherent state.

Energies of interest correspond to free space matterwave wavelengths on the order of 1 μm and less. The oscillator well can be treated as a closed system having a harmonic particle potential. Such a closed system in thermal equilibrium at sufficiently low temperature consists of a Bose-condensed gas in a ground state. The condensate forms not in the ground state, but in a displaced ground state, i.e., a coherent state of the harmonic oscillator.

The oscillator is coupled via tunneling to a reservoir of particles at fixed temperature and chemical potential functioning as a "battery" coupled to the source well on the one side, and to the vacuum on the other side. The battery drives the oscillator dynamics. A many-body approach is used to analyze the interaction energy between the harmonic oscillator modes that couple the oscillator to the source and vacuum.

The behavior of the oscillator is critically governed by a feedback parameter $\upsilon = (V_{IN} - V_{OUT})/(k_B T_B)$, where $V_{IN}$, $V_{OUT}$ are the barrier heights, $k_B$ is Boltzmann's constant, and $T_B$ is the temperature of the particles in the source well. Atoms flow from the source to the vacuum provided that the barriers are sufficiently low and/or sufficiently narrow. An unintuitive result from the kinetic treatment is that atoms in the oscillator are colder, $T_{OSC} < T_B$, and acquire a higher chemical potential, $\mu_{osc} > \mu_s$, than those in the source given feedback above a particular threshold value.

A large bias $V_{SS}$ is added to the source well and the source atoms are made to be very cold. There are two energy scales that define "very cold": one is the range of energies δE over which atom transport across a single barrier is wave-like, that is, non-classical. Given an ensemble of atoms with thermal energy $k_{BT}$, δE on one side of a barrier, the flux of atoms to the other side are dominated by the non-classical component. The other energy scale is the characteristic energy level spacing $\Delta E_{OSC}$ of the oscillator. When powered by atoms having very low temperature, i.e., such that $\Delta E_{osc} > k_{BT}$, we can expect the behavior of the oscillator to be dominated by quantum effects.

The oscillator is powered by a "battery" consisting of an ensemble of particles residing in the source well at a chemical potential $\mu_B$ and temperature $T_B$. The oscillation frequency is determined by the harmonic oscillation frequency; in addition to this frequency, the oscillator is characterized by the number N of fully trapped levels. Oscillator feedback is set by the barrier height difference. In FIG. 5A, the vertical direction depicts potential energy, and the horizontal direction is a spatial coordinate.

Atoms enter oscillator 114 (FIGS. 2A and 2b) with an average potential energy of Vss. Oscillator 114 is a potential well defined in part by magnetic fields and in part of light-field mirror-barriers 206 and 208. Atoms that enter bounce back and forth between barriers 206 and 208 in various harmonic modes (N, N−1, N−2, etc.). The kinetic energy and the potential energy of the atoms vary sinusoidally so that their total energy remains constant. The oscillating atoms constitute an COMW that intensifies to the extent that a "transmitted" portion exits oscillator 114 through exit barrier 208. As indicated in FIG. 2B, the transmitted COMW retains the sinusoidal characteristics of the matterwaves within oscillator 114.

The output spectrum for oscillator 114 can vary according to a number of parameters, including the separation and relative heights of the entrance and exit barriers, and the characteristics of the incoming atoms that can vary according to $V_{SS}$, $T_B$ and $\mu_B$. Accordingly, resonator 124 (FIG. 1) is used to stabilize the output of oscillator 114. The resonant modes supported by resonator 124 are mostly determined by the readily controlled separation of mirrors 136 and 138. Resonant modes are reinforced while non-resonant modes of the incoming COMW are cancelled. As a result, the resonator output can have a narrower bandwidth output than the oscillator, and the intensity of the resonator output is a measure of the spectral match between the oscillator and the resonator.

The output of resonator 124, after being split by matterwave splitter 122, is input to sensor 126. Sensor 126 measures the intensity of the feedback COMW from resonator 124. For example, magnetic and light field generator 116 can illuminate atoms for a set time interval and then count the number of fluorescing atoms. The fluorescence count corresponds to the intensity of the feedback COMW. The count is provided to magnetic and light field generator 116 which can dither and otherwise adjust parameters of COMW generator 110 to maximize or otherwise optimize the resulting feedback COMW intensity and/or spectrum. This optimization of the feedback COMW then corresponds to an optimal system output COMW 132.

While resonators can be relatively stable, the frequency of a resonant mode can increase with increasing g-forces (forces due to gravity or acceleration) in the direction of mirror separation. Such frequency variations can be avoided by avoiding changing g-forces. Alternatively, such frequency variations can be compensated by changing mirror separation as a function of g-force strength along the direction of mirror separation. On the other hand, g-forces can be detected and measured as a function of resonator frequency changes, e.g., by obtaining a spectrum of the feedback COMW.

The generated matterwaves 130 exiting COMW generator 110 are split by beam-splitter 122 which, in the illustrated embodiment, has a reflectivity R=0.5 and a corresponding transmissivity of T=1-R=0.5. The transmitted output COMW 134 serves as the system output, while the reflected COMW 134 is directed to resonator 124. Front mirror 136 of resonator 124 has a reflectivity of R=0.999 and a corresponding transmissivity of T=1-R=0.001. Thus, about 0.1% of the matterwaves 134 reaching resonator 124 are admitted to resonator 124. The rest of the matterwaves are reflected back toward beam splitter 122.

The portion of the matterwaves that enters resonator 124 bounces back and forth between front mirror 136 and rear mirror 138, which are spaced a distance L apart. The effective number of bounces is b=F/2π, where $$F = \pi\sqrt{R}/1-R$$

In the illustrated embodiment, the reflectivity R=0.99, so the finesse F≈312 and the effective number of bounces b≈50. In practice, finesse can range from 100 to 1,000,000. The matterwave intensity is much higher within the resonator than outside:

$$I_{inside} = \frac{I_{incident}}{T}$$

So, in the illustrated case in which T=0.01, $I_{inside}$=100× $I_{incident}$ is resonating to narrow the matterwave spectral bandwidth about a frequency based on the distance L.

A small portion of the narrow bandwidth matterwaves escapes resonator 124 through front mirror 136 to form feedback COMW 140. This feedback COMW 140 is split by beam splitter 122 so that half returns to the oscillator 114 and half is diverted to sensor 126. Sensor 126 forwards the frequency detection to light and magnetic field generator 116, which uses it to control COMW generator 110 to stabilize the resonant matterwave frequency output of matterwave oscillator 114 and thus of system 100. Those skilled in the art can recognize that system 100 implements a matterwave analog of a Pound-Drever-Hall frequency locking scheme. It is straight forward to adjust reflectivity and transmission characteristics of mirrors and to control cavity finesse.

Coherent oscillatory matterwaves (COMW) differ from de Broglie matterwaves. De Broglie matterwaves are solutions to the Schrödinger equation:

$$H\psi = E\psi$$

The solutions can be free-space plane waves $$\psi = Ne^{i(kz-\omega t)} \text{ where } E = \frac{1}{2}mv^2;$$

$$\omega = \frac{E}{\hbar};$$

$$k = \frac{2\pi}{\lambda};$$

$$\lambda = \frac{2\pi}{mv}.$$

Coherent oscillatory matterwaves are associated with a flux of particles (e.g., atoms) whose potential and kinetic energy oscillate in time such that their total energy remains constant. Matterwaves are characterized in terms of a pair of fields in analogy with the potential F(z,t) and current I(z,t) of an electrical circuit, or E and B fields of an electromagnetic wave, having frequency ω.

$$F(z,t) = F_0 \cos(k_m z - \omega_0 t)$$

$$(z,t) = I_0 \cos(k_m z - \omega_0 t)$$

Figure 8:
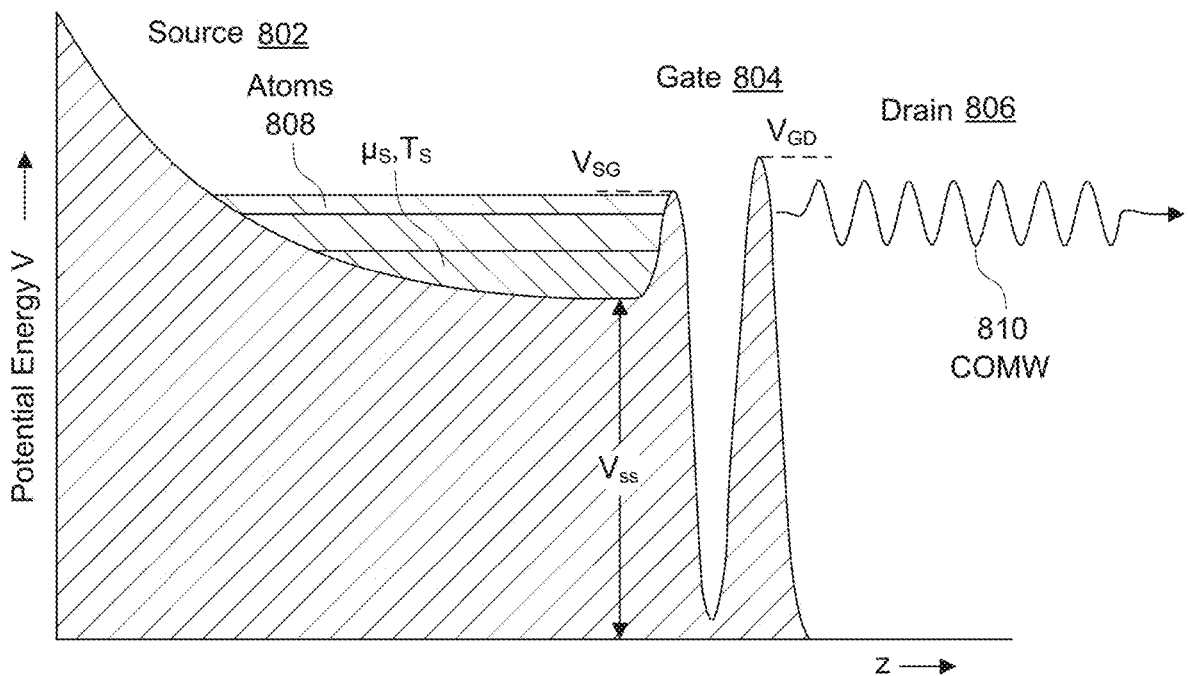
FIG. 8 is a schematic diagram of an atomtronic transistor.

COMWs can be generated and emitted by an atomtronic transistor oscillator as represented in FIG. 8. FIG. 8 is a graph of potential energy V versus position z for an atomtronic transistor oscillator. The source 802, gate 804 and drain 806 of the atomtronic oscillator correspond to the atom source, the oscillator, and free space of COMW generator of FIG. 2. $V_{ss}$, $\mu_s$, and $T_s$ have the meanings given to them FIG. 2, while the source-gate potential $V_{SG}$ and the gate-drain potential $V_{GD}$ correspond to $V_{in}$ and $V_{out}$ in FIG. 2. Source 802 is populated by BEC atoms 808, while COMW 810 are emitted by gate 804.

Note that the frequency of a COMW is the oscillator frequency $\omega_0$. Define the frequency $$\omega_d = \frac{E_d = V_{de}}{\hbar},$$

where $E_d$ is the total particle energy. The field amplitudes are related through an impedance.

$$F_0 = I_0 Z; Z = n^2 \frac{\omega_0}{2m} \equiv n^2 Z_0$$

where $n^2 \equiv \frac{\omega_0}{\omega_d}$ serves as an index of refraction. The velocity is:

$$v = \frac{1}{n}\sqrt{\frac{2\hbar\omega_0}{m}}$$

The wavenumber is:

$$k_m = n\sqrt{\frac{m\omega_0}{2\hbar}}$$

The wave amplitudes are determined from the particle flux:

$$I_0 = 2/n\sqrt{m\hbar I_d}.$$

Figure 9A:
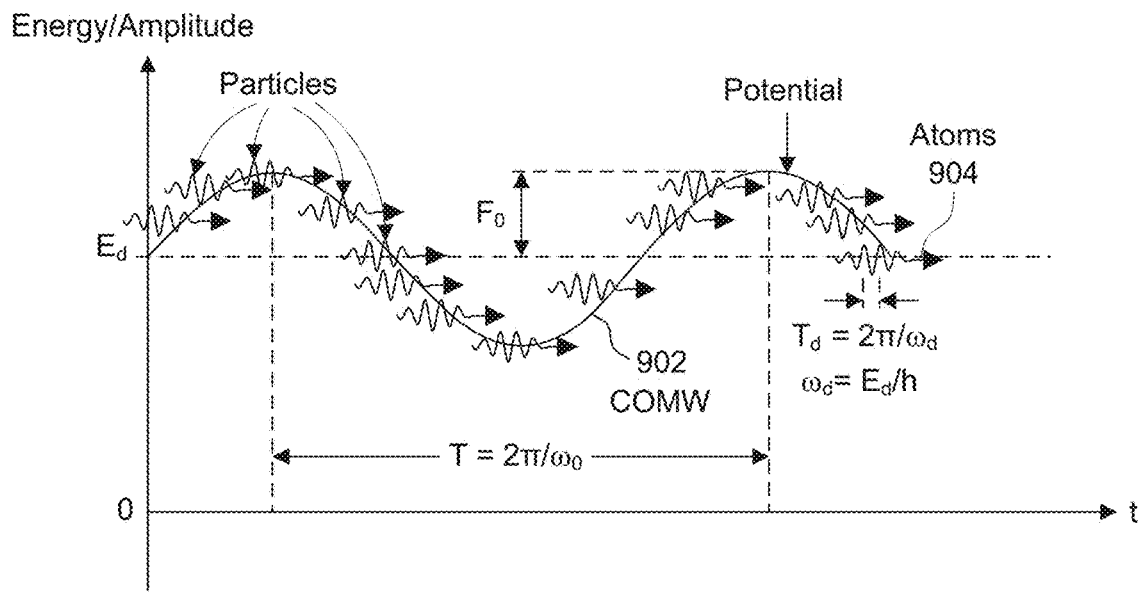
FIG. 9A is a graph of energy/amplitude $E_d$ as a function of time t for a COMW.

FIG. 9a is a graph of energy/amplitude $E_d$ over time t Note that the wavelength of COMW 902 is T=$2\pi/\omega_0$, while the wavelength of an individual atom 904 is $T_d = 2\pi/\omega_d$, where $\omega_d = E_d/\hbar$.

Figure 9B:
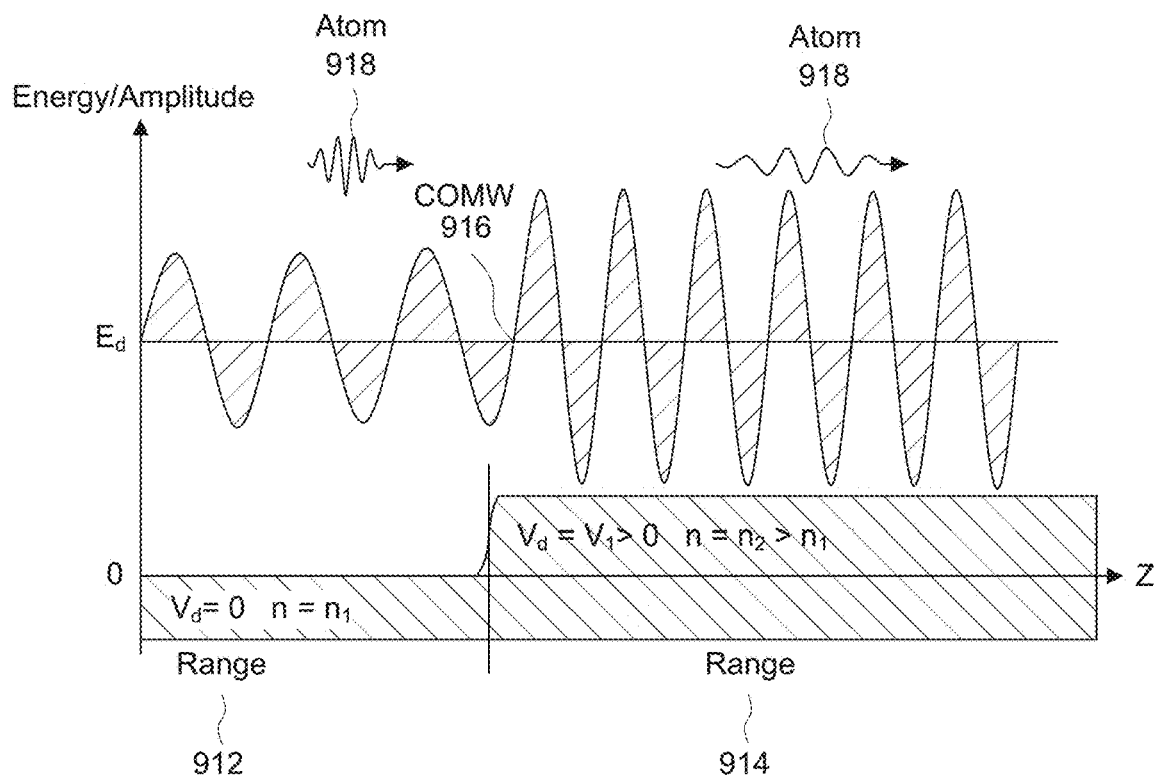
FIG. 9B is an energy/amplitude $E_d$ as a function of time t as it transitions from a range with a relatively low index of refraction to a range with a relatively high index of refraction.

FIG. 9B is a graph of energy/amplitude $E_d$ over position z. The position dimension z includes a range 912 with a relatively low index of refraction $n_1$ (with potential energy $V_d = 0$ and a range 914 with a relatively high index of refraction $n_2$ (with potential energy $V_d > 0$). Note that the amplitude and frequency of the COMW 916 increase (and wavelength decreases) when transitioning to a higher index of refraction. This phenomenon is opposite that of de Broglie waves 918 which decrease in frequency and amplitude and increase in wavelength when transitioning to a higher index of refraction.

Figure 10A:
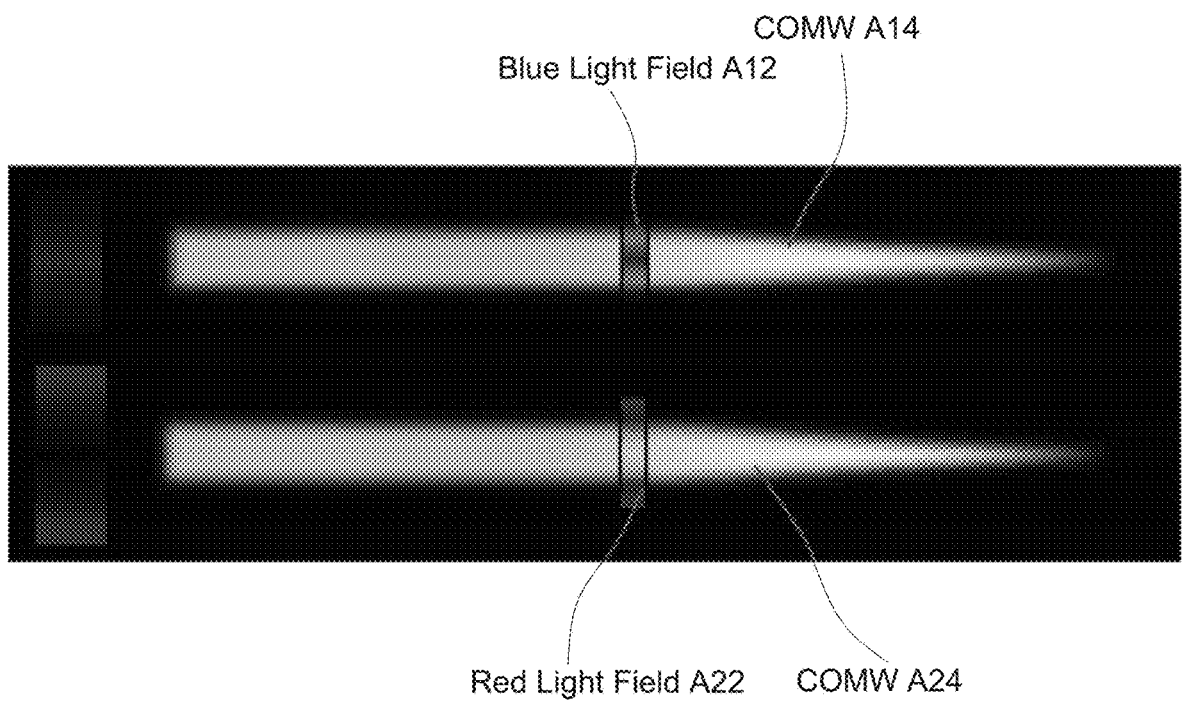
FIG. 10A is a screen shot for positive (focusing) lenses formed with a blue light field and a red light field respectively.

Lenses for COMWs can be formed of fields of light detuned with respect to a resonance transition of the COMW particles, e.g., atoms. For example, as shown in FIG. 10A a light field A12 with a blue-detuned (slightly higher frequency and slightly shorter wavelength than that associated with the resonance transition) maximum intensity center can define a "positive" lens for focusing a COMW A14. Alternatively, a light field A22 with a red-detuned (slightly lower frequency and slightly longer wavelength than that associated with the resonance transition) minimum intensity center can define a "positive" lens for focusing a COMW A24. In both positive-lens cases, one can say that the center of the lens is blue-detuned relative to the periphery of the lens.

Figure 10B:
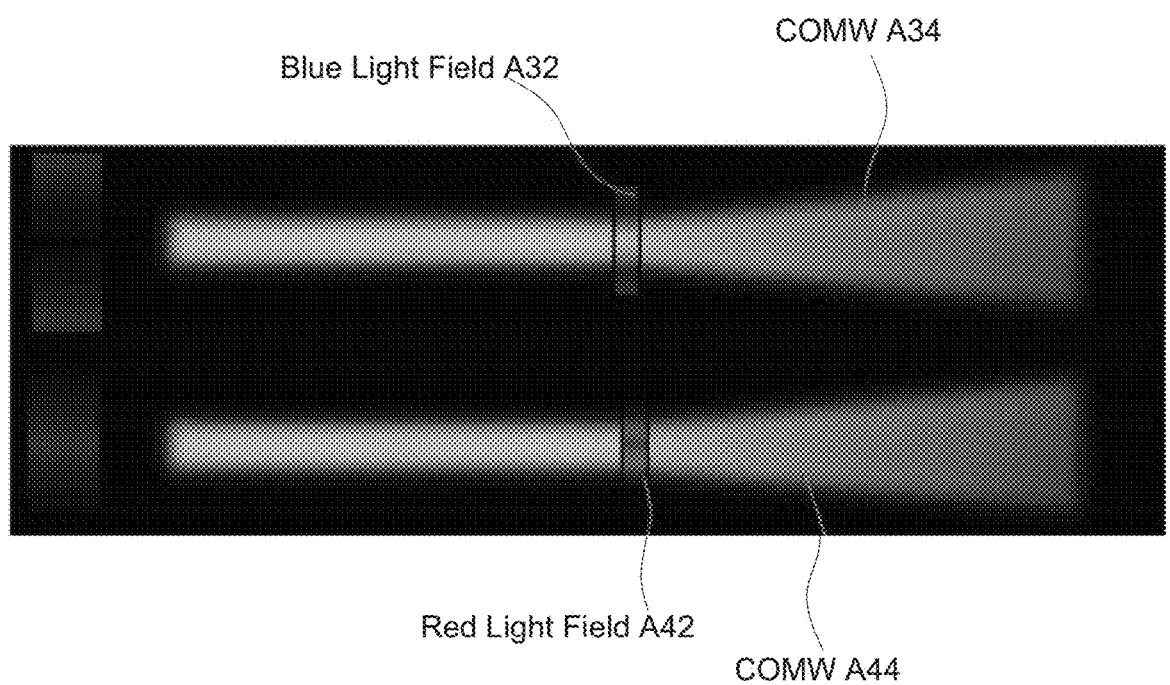
FIG. 10B is a screen shot for negative (diverging) lenses formed with a blue light field and a red light field respectively.

Negative lenses can also be formed to cause a COMW to diverge as shown in FIG. 10B. In the upper example, a light field A32 with a blue-detuned minimum intensity center can define a "negative" lens for COMW A34. In the lower example, a light field A42 with a red-detuned maximum intensity center can define a "negative" lens for COMW A44. In both negative-lens cases, one can say the center of the lens is red-detuned relative to the periphery of the lens.

Figure 11:
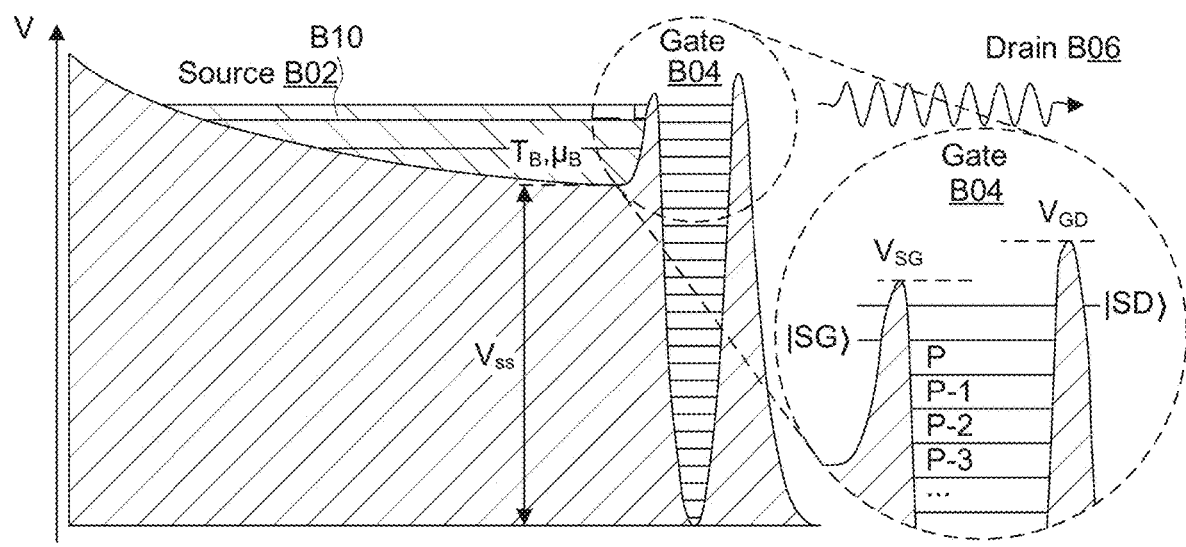
FIG. 11 is a schematic diagram of the atomtronic transistor of FIG. 8 including a detail of the gate.

The oscillator circuit of FIG. 11 can be produced by a "painted optical potential" using a scanned, blue-detuned laser beam in conjunction with a magnetic trap. The atomic potential consists of three regions: source B02, gate B04 and drain B06, analogous to components of a field-effect transistor (FET). The "drain" B06 is connected to a (free space) vacuum. The source well is biased with a large potential $V_{SS}$. Entrance and exit barriers/mirrors B12 and B14 border the gate region, which is shaped to be a harmonic potential with equal energy level spacings P, P-1, P-2, P-3, and so on and different barrier heights $V_{SG}$ and $V_{SD}$. The "transistor modes" are the upper most two levels: source-gate tunneling and source-gate-drain tunneling. A Bose condensate residing in the source well serves as a battery to power the circuit.

Figure 12:
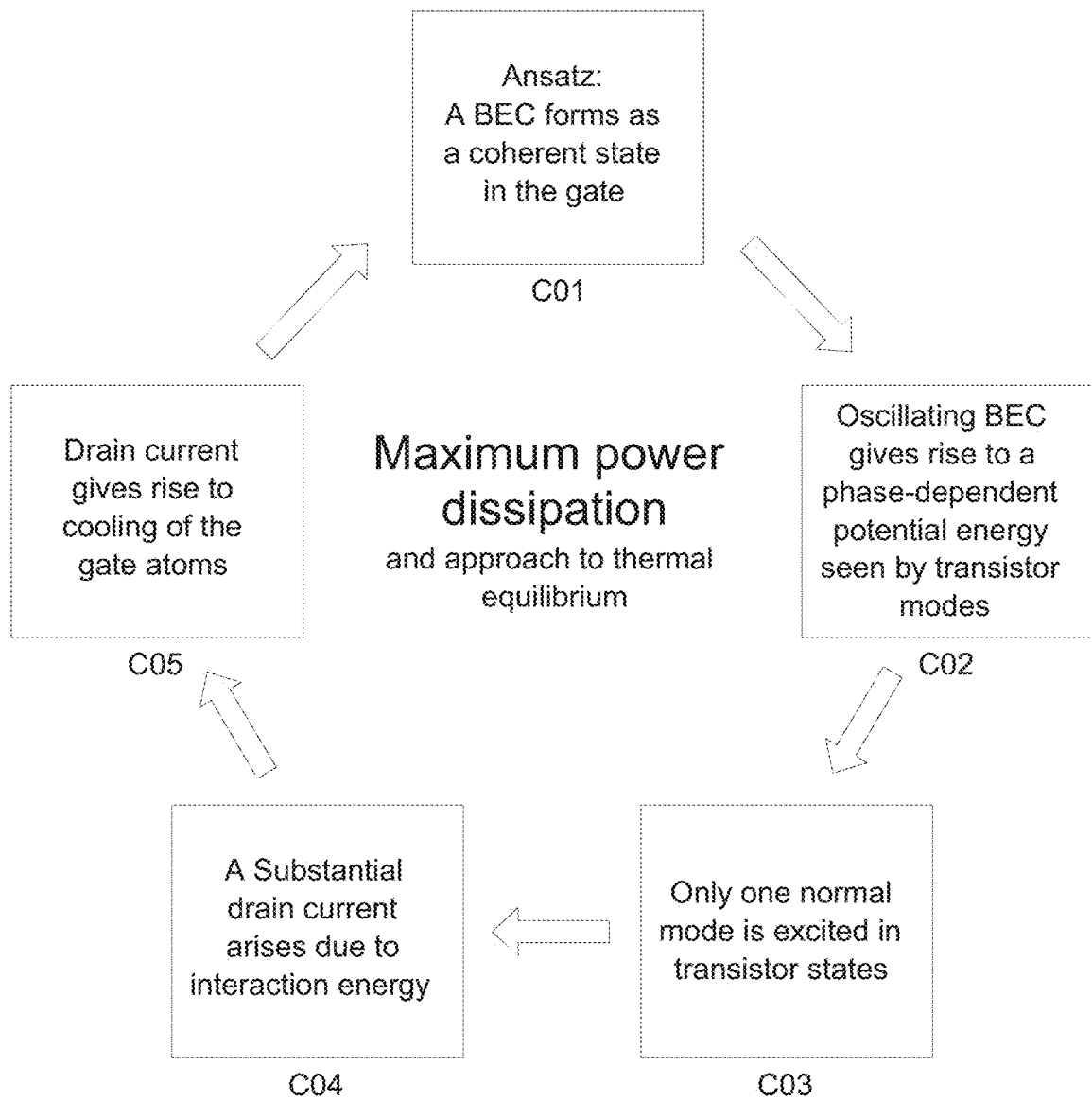
FIG. 12 is a flow diagram of a driven oscillator process for the atomtronic transistor process of FIG. 8.

A driven oscillation process C00, summarized in FIG. 12, explains how an atomtronic transistor generates COMWs. At C01 a Bose-Einstein condensate (BEC) forms as a coherent state in the gate. At C02, the oscillating BEC gives rise to a phase-dependent potential energy seen by transistor modes. At C03, exactly one normal mode is excited in transistor states. At C04, a substantial drain current arises due to interaction energy. At C05, drain current gives rise to cooling of the gate atoms, which leads to the BEC formation of C01. This atomtronic transistor cycle gives rise to maximum power dissipation and an approach to thermal equilibrium. The drain output current is manifest as a coherent matterwave. The wave's potential and kinetic energy oscillate with the frequency of the condensate in such a way that the total energy of the underlying atoms remains constant.

Figure 13A:
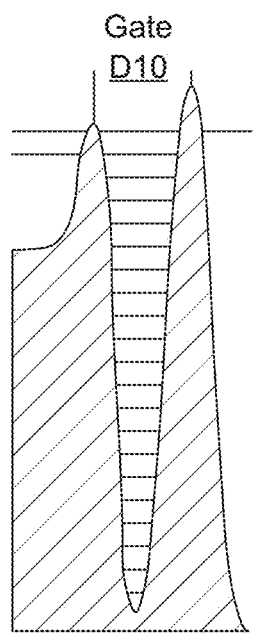
FIG. 13A is a representation of a gate corresponding to a harmonic oscillator.
Figure 13B:
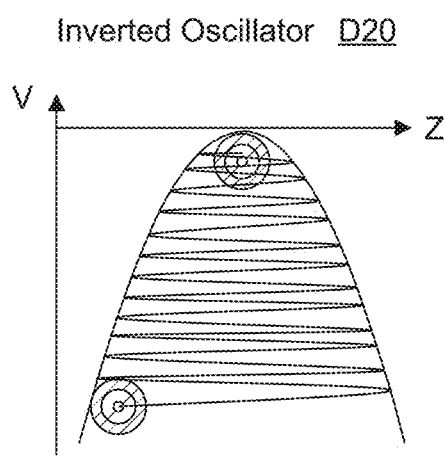
FIG. 13B is a representation of an inverted classical oscillator.
Figure 13C:
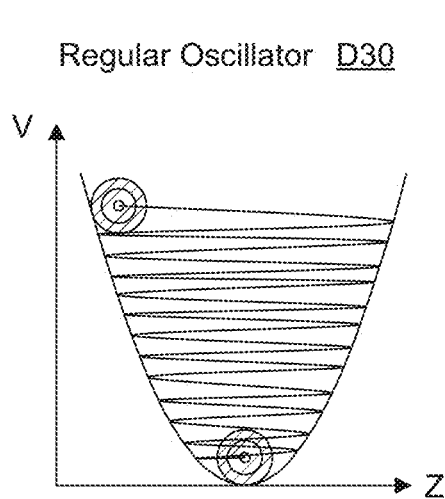
FIG. 13C is a representation of a regular classical oscillator.

The atomtronic transistor exhibits current gain, analogous to an inverted oscillator described by Roy J. Glauber in "Amplifiers, Attenuators, and Schrödinger's Cat", Volume 480, Issue 1 "New Techniques and Ideas in Quantum Measurement Theory" December 1986, Pages 336-372. An oscillator coupled to a reservoir experiences negative damping, i.e., gain. The oscillator levels lie below the levels of the reservoir, as in the case of the atomtronic transistor. The atomtronic transistor gate is the harmonic oscillator and the source+BEC serves as the reservoir. Compare gate D10 of FIG. 13A with the inverted oscillator D20 of FIG. 13B and contrast with regular oscillator D30 of FIG. 13C.

Figure 14:
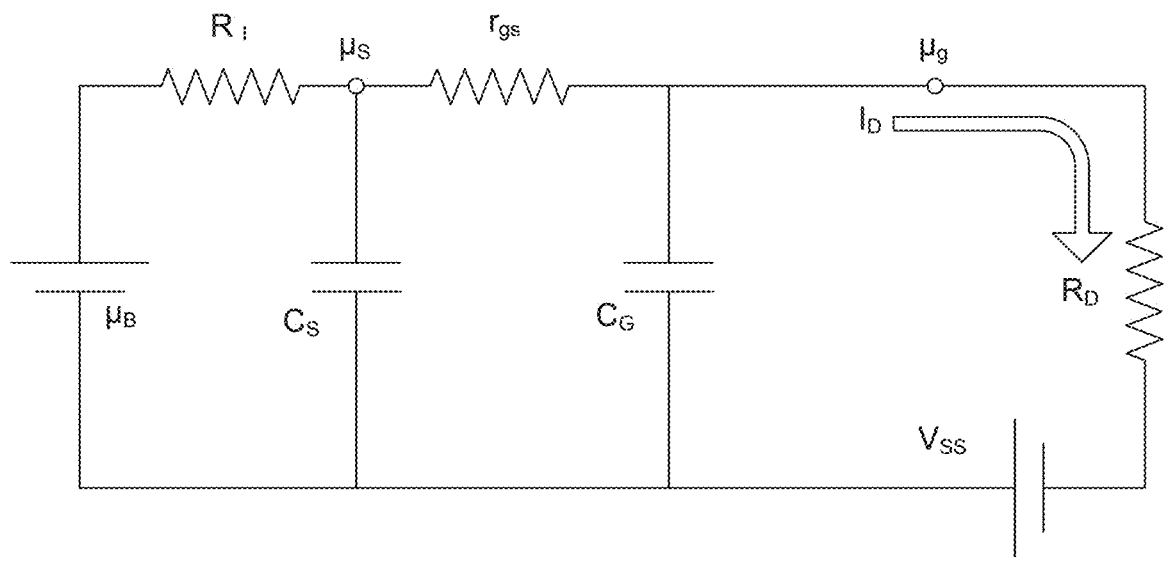
FIG. 14 is a classical equivalent circuit for an atomtronic transistor.

A classical equivalent circuit E00 for the atomtronic transistor is shown in FIG. 14. The gain of the transistor is reflected by a negative resistance $r_{gs}$. The negative resistance $r_{gs}$ dissipates negative power; in other words, the native resistance causes cooling. The atomtronic circuit is powered by the chemical potential $\mu_B$ of the battery. The battery has internal resistance $R_1$. The capacitances $C_S$ and $C_G$ determine particle numbers M=µC. Bias is supplied by an external atomic potential $V_{ss}$. The gate-source resistance $r_{gs}$ determines the "drop" between the source and gate due to a drain current $I_D$. Drain resistance $R_D$ accounts for power lost to the vacuum.

Figure 15A:
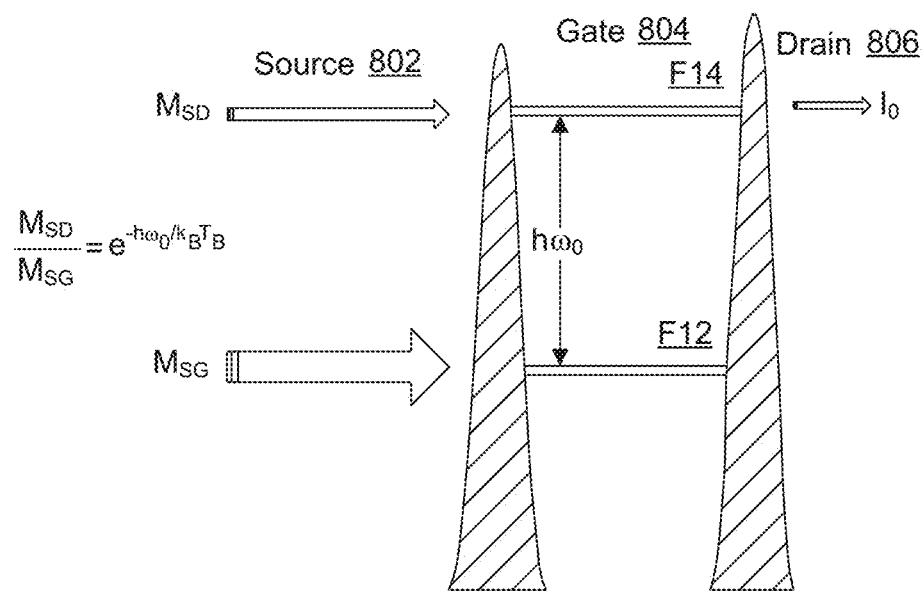
FIGS. 15A and 15B are representations of gate barriers of the gate of the atomtronic transistor of FIG. 8.

In the absence of coupling to the BEC, there are fewer particles in the upper transistor state relative to the lower state by a Boltzmann factor, as represented in FIG. 15A, which results in a lower drain current $I_D = I_0$, where $$I_0 = M_{SG}\Gamma_T \text{Exp}\left(-\frac{\hbar\omega_0}{k_B T_S}\right).$$

Figure 15B:
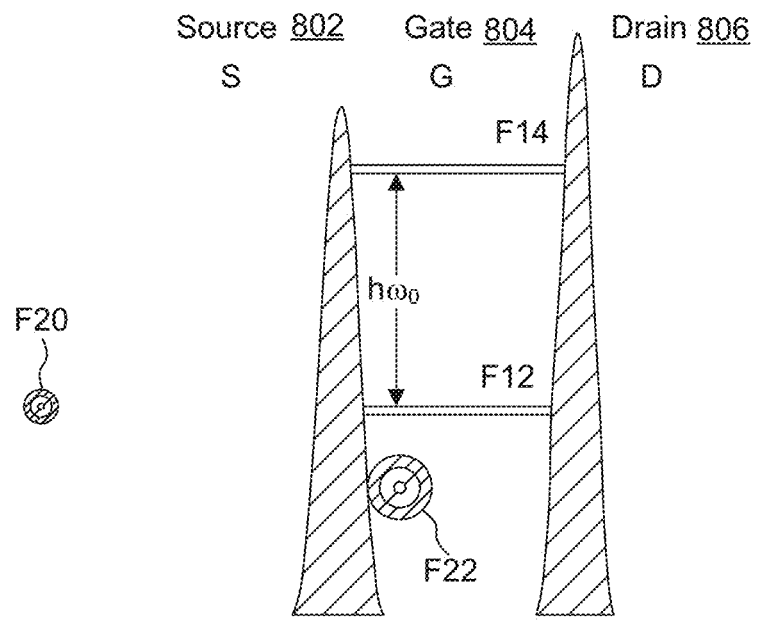

Coupling to the BEC has the effect indicated in FIG. 15B. Every incoming particle F22 is a 50-50 superposition of the two normal modes F12 and F14, separated by an energy $\hbar\omega_0$. Most particles F20 enter the lower state F12. The probability that a particle enters through the lower state F12 is $$\varrho = 1 - \mathrm{Exp}\left(-\frac{\hbar\omega_0}{k_B T_s}\right)$$

The particles F22 can only leave from the upper state F14. The gate interaction (BEC coupling) helps ensure atoms transition from the lower to the upper state. This removes energy from the system to the tune of $\hbar\omega_0$ per particle. The heat removed from the system is $$P_d = \varrho\, \hbar\omega_0 I_d,$$

where $I_d$ is the particle flux.

As indicated above, a COMW can be described in terms of potential and current fields:

$$F(z,t) = F_0 \cos(k_m z - \omega_0 t)$$

$$I(z,t) = I_0 \cos(k_m z - \omega_0 t)$$

Figure 16A:
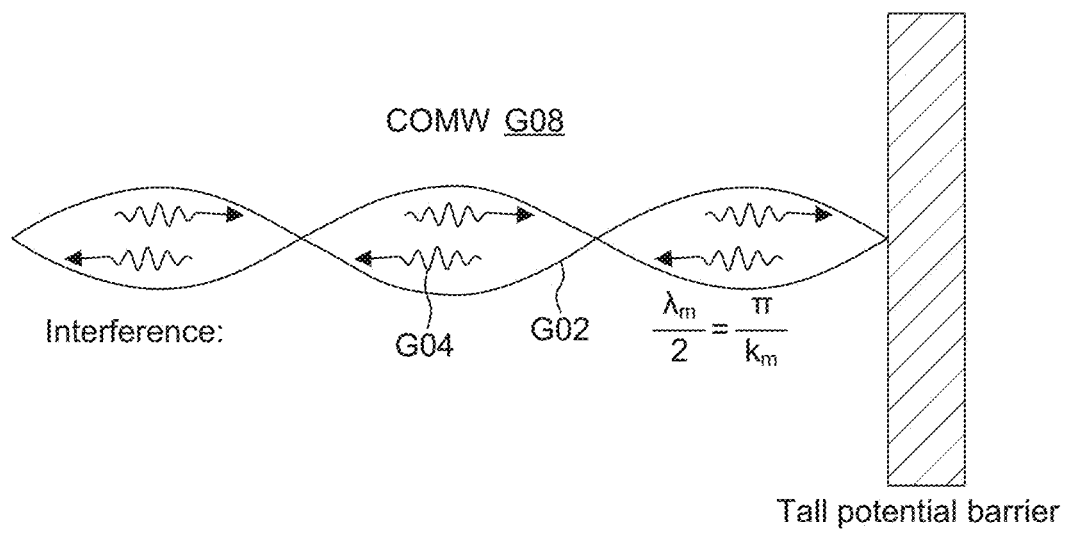
FIG. 16A is a representation of a COMW reflecting off a tall potential barrier.

Note that, in FIG. 16A, interference between incident G02 and reflected G04 (by tall potential G06) portions G02 and G04 of COMW G08 is not given by the de Broglie wavelength $\lambda_d$ (which is here much shorter than the COMW wavelength $\lambda_m$.)

$$\lambda_d = \lambda_m \omega_0/\omega_d \text{ and } \lambda_m = 2\pi/k_m$$

Note, too, that the total power carried by the atom flux is more than just from the wave.

$$\langle P_{Tot}\rangle = I_d \hbar\omega_d \text{ versus } \langle P_d\rangle = I_d \hbar\omega_0 = V_0 \mu_B C_s \omega_0$$

This is because the atoms have been accelerated by the bias $V_{ss}$.

An electronic oscillator or laser emits an E-M wave. The E-M wave is associated with the minimum energy packet called "the photon". However, the dual of the photon in the context of a coherent oscillatory matterwave is not an atom but something else: a "matteron".

Figure 16B:
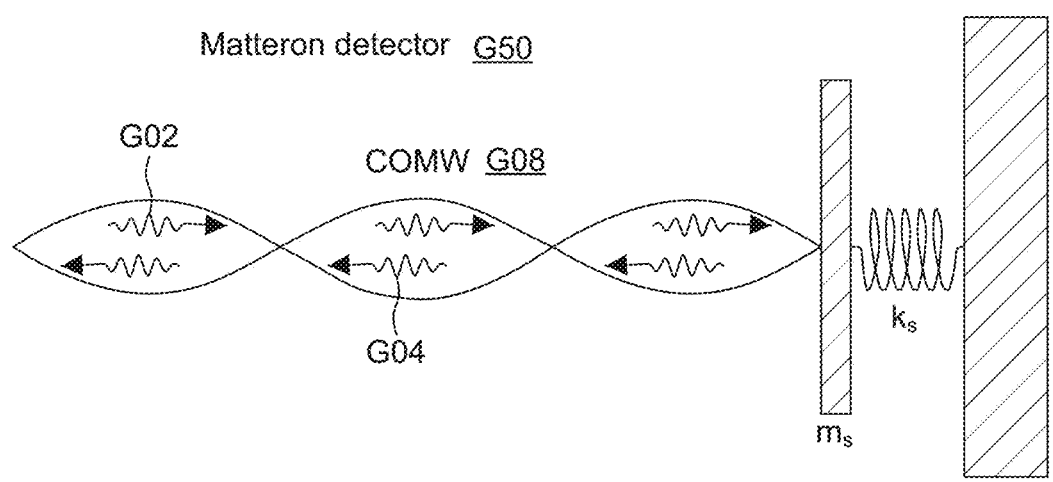
FIG. 16B shows a matter on detector with a conceptual spring between a mass and a tall potential barrier.

As shown in FIG. 16B, a matteron detector G50 can be made with a mass-spring system:

$$\omega_S = \sqrt{k_S/m_S}$$

where $\omega_S$ is a COMW frequency, $k_S$ is a spring constant and $m_S$ is a mass. Pressure from the atoms causes the spring to compress while oscillating pressure from the matterons cause mechanical oscillation provided $\omega_S = \omega_0$ but not otherwise. Atom number is conserved but matteron number is not conserved. Matterons exhibit Poisson statistics and reflect underlying spontaneous emission of the oscillator. Matterons carry momentum $$p = \hbar k = \sqrt{2m\hbar\omega_0}.$$

In summary, coherent oscillatory matterwaves: are matterwave analogs to electromagnetic waves (voltage and current); are different in character and behavior from de Broglie matterwaves; can be manipulated with "optical" elements formed of light; enable resonant matterwave interferometers for precision measurements; and can be emitted by an atomtronic transistor oscillator. The matterwave analog of the photon is not an atom, but rather a "matteron".

Further details of COMWs and their relation to atomtronics are presented by Dana Z. Anderson in "Matter waves, single-mode excitations of the matter-wave field, and the atomtronic transistor oscillator" in *Physical Review* A 00, 003300, published 2021 Sep. 8 by the American Physical Society. This article is incorporated herein by reference in full.

While in the illustrated embodiments, COMW travel back and forth between a pair of mirrors in a resonator, in other resonators, other closed-loop path types can be implemented. For example, the COMW can travel about a ring with three or more reflections or travel around more complex paths. In some cases, paths with four or more segments can be planar or extend into a third dimension. In each case, the COMW travels about a closed loop of two or more path segments.

Herein, a "molecular entity" is "any constitutionally or isotopically distinct atom, molecule, ion, ion pair, radical, radical ion, complex, conformer, etc., identifiable as a separately distinguishable entity". Herein, a "boson" is any particle that has integer spin and thus follows Bose-Einstein statistics. Thus, a "molecular-entity boson" is any particle that is both a molecular entity and a boson. Of particular interest herein, neutral atoms with an even number of neutrons are molecular-entity bosons. Herein, a "coherent oscillatory matterwave" is a matterwave with a wavelength corresponding to that of a standing wave in a harmonic oscillator from which the matterwave was transmitted. Herein, "detuned" refers to electro-magnetic radiation that has a wavelength within 1% of a resonance wavelength but is not equal to the resonance wavelength. Herein, "closed loop" characterizes a control system in which the controlling action is depending on the generated output of the system.

Herein, all art labeled "prior art", if any, is admitted prior art; all art not labeled "prior art", if any, is not admitted prior art. The disclosed embodiments, variations thereupon and modifications thereto are provided for by the present invention, the scope of which is defined by the accompanying claims.

What is claimed is:

1. A closed-loop coherent oscillatory matterwave (COMW) process comprising:
   molecular entity bosons entering a COMW oscillator;
   driving oscillations in the COMW oscillator using a dipole oscillating Bose-Einstein condensate;
   the molecular entity bosons forming a COMW in the COMW oscillator;
   transmitting COMW from the COMW oscillator;
   receiving at least a portion of the COMW by a resonator;
   transmitting feedback COMW from the resonator; and
   adjusting COMW oscillator operation based on the feedback COMW.

2. The closed-loop COMW process of claim 1 further comprising evaluating parameters of the feedback COMW to obtain evaluations, the adjusting including modifying the COMW oscillator based on the evaluations.

3. The closed-loop COMW process of claim 1 further comprising splitting the COMW transmitted from the COMW oscillator into an output portion and a regulator portion, the portion received by the resonator including the regulator portion.

4. The closed-loop COMW process of claim 3 comprising splitting the COMW transmitted from the COMW oscillator using a splitter formed of light fields of visible, ultraviolet, or infrared field light.

5. The closed-loop COMW process of claim 4 wherein the visible, ultraviolet, or infrared field light includes light that is detuned with respect to a resonant wavelength for the molecular entity bosons.

6. A closed-loop coherent oscillatory matterwave (COMW) process comprising:

molecular entity bosons entering a COMW oscillator;
the molecular entity bosons forming a COMW in the COMW oscillator, wherein the molecular entity bosons are atoms with an even number of neutrons;
transmitting COMW from the COMW oscillator;
receiving at least a portion of the COMW by a resonator;
transmitting feedback COMW from the resonator; and
adjusting COMW oscillator operation based on the feedback COMW.

7. A closed-loop coherent oscillatory matterwave (COMW) system comprising:
a COMW oscillator for generating a standing COMW and emitting COMW;
a matterwave resonator for generating and transmitting feedback COMW in response to receiving at least a portion of the emitted COMW;
a controller for adjusting the COMW oscillator based on the feedback COMW; and
a laser system for producing a light-field beam splitter that splits the COMW into an output portion and a regulator portion, the regulator portion including the portion of the COMW received by the matterwave resonator.

8. The closed-loop COMW system of claim 7 further comprising a sensor for evaluating the feedback COMW to obtain evaluations, the adjusting being based on the evaluations.

9. The closed-loop COMW system of claim 7 further comprising a boson source of molecular-entity bosons that when received by the COMW oscillator populate the COMW.

10. The closed-loop COMW system of claim 9 wherein the COMW transmitted from the COMW oscillator has a COMW velocity and the molecular-entity bosons that populate the COMW transmitted from the COMW oscillator have an average atom velocity different from the COMW velocity.

11. The closed-loop COMW system of claim 9, wherein the light field beam splitter includes light of a wavelength that is detuned with respect to a COMW wavelength of the molecular-entity bosons.

12. The closed-loop COMW system of claim 9, wherein the light-field beam splitter includes light of a wavelength that is blue-detuned with respect to a resonance wavelength of the molecular-entity bosons.

13. The closed-loop COMW system of claim 7, wherein the matterwave resonator includes entrance and exit barriers and the resonator includes reflectors, the entrance and exit barriers and the reflectors being formed using light fields generated by the laser system.

14. The closed-loop COMW system of claim 8, wherein the COMW sensor measures an intensity of the feedback COMW.

15. The closed-loop COMW system of claim 14 wherein the COMW sensor measures intensity as a function of a number of atoms captured over a known duration.

* * * * *